United States Patent
Satou et al.

(10) Patent No.: US 10,800,914 B2
(45) Date of Patent: *Oct. 13, 2020

(54) ACTIVE ESTER COMPOSITION AND CURED PRODUCT THEREOF

(71) Applicant: DIC Corporation, Tokyo (JP)

(72) Inventors: Yutaka Satou, Ichihara (JP); Akito Kawasaki, Ichihara (JP); Tatsuya Okamoto, Ichihara (JP); Kazuhisa Yamoto, Ichihara (JP)

(73) Assignee: DIC Corporation, Tokyo (JP)

( * ) Notice: Subject to any disclaimer, the term of this patent is extended or adjusted under 35 U.S.C. 154(b) by 70 days.

This patent is subject to a terminal disclaimer.

(21) Appl. No.: 16/313,293

(22) PCT Filed: Jun. 22, 2017

(86) PCT No.: PCT/JP2017/023002
§ 371 (c)(1),
(2) Date: Dec. 26, 2018

(87) PCT Pub. No.: WO2018/008416
PCT Pub. Date: Jan. 11, 2018

(65) Prior Publication Data
US 2019/0153215 A1 May 23, 2019

(30) Foreign Application Priority Data

| Jul. 6, 2016 | (JP) | 2016-134227 |
| Jul. 15, 2016 | (JP) | 2016-140419 |
| Jul. 15, 2016 | (JP) | 2016-140420 |
| Jul. 15, 2016 | (JP) | 2016-140421 |
| Jul. 15, 2016 | (JP) | 2016-140422 |
| Aug. 9, 2016 | (JP) | 2016-156536 |
| Aug. 10, 2016 | (JP) | 2016-157670 |

(51) Int. Cl.
| C08L 67/02 | (2006.01) |
| H01L 23/31 | (2006.01) |
| H01L 23/29 | (2006.01) |
| C08G 59/02 | (2006.01) |
| H05K 1/03 | (2006.01) |
| C08L 61/06 | (2006.01) |
| H01B 3/42 | (2006.01) |
| C08L 63/00 | (2006.01) |

(52) U.S. Cl.
CPC ............. *C08L 67/02* (2013.01); *C08G 59/02* (2013.01); *C08L 61/06* (2013.01); *H01B 3/421* (2013.01); *H01L 23/29* (2013.01); *H01L 23/293* (2013.01); *H01L 23/31* (2013.01); *H05K 1/03* (2013.01); *C08L 63/00* (2013.01); *C08L 2203/206* (2013.01)

(58) Field of Classification Search
CPC ... C08G 59/02; C08L 2203/206; C08L 61/06; C08L 63/00; C08L 67/02; H01B 3/421; H01L 23/29; H01L 23/293; H01L 23/31; H05K 1/03; H05K 1/0326
See application file for complete search history.

(56) References Cited

U.S. PATENT DOCUMENTS

2005/0003199 A1    1/2005    Takaya et al.

FOREIGN PATENT DOCUMENTS

| JP | 2003-082063 A | 3/2003 |
| JP | 2004-210936 A | 7/2004 |
| JP | 2004-224890 A | 8/2004 |

OTHER PUBLICATIONS

International Search Report dated Sep. 19, 2017, issued for PCT/JP2017/023002.

*Primary Examiner* — Lawrence D Ferguson
(74) *Attorney, Agent, or Firm* — Locke Lord LLP

(57) ABSTRACT

Provided are an active ester composition capable of exhibiting high curability and forming a cured product with various excellent properties such as low dielectric properties, a cured product thereof, and a semiconductor encapsulating material and a printed wiring board which are obtained using the active ester composition. The active ester composition includes, as essential components, an active ester compound (A) and a phenolic hydroxyl group-containing compound (B), in which the active ester compound (A) is an esterification product of a compound having one phenolic hydroxyl group in the molecular structure (a1) and an aromatic polycarboxylic acid or an acid halide thereof (a2). Also provided are a cured product thereof, and a semiconductor encapsulating material and a printed wiring board which are obtained using the active ester composition.

10 Claims, No Drawings

ACTIVE ESTER COMPOSITION AND CURED PRODUCT THEREOF

TECHNICAL FIELD

The present invention relates to an active ester composition capable of exhibiting high curability and forming a cured product with various excellent properties such as low dielectric properties, and also relates to a curable composition and a cured product thereof, and a semiconductor encapsulating material and a printed wiring board which are obtained using the curable composition.

BACKGROUND ART

In the technical field of insulating materials which are used in semiconductors, multi-layer printed boards, and the like, with a decrease in thickness and size of various electric members, development of new resin materials according to those market trends is demanded. For example, in order to cope with increasing of signal speed and increasing of frequency and to decrease heat energy loss, development of resin materials having both a low dielectric constant and a low dielectric tangent in a cured product is demanded. Furthermore, as performance required in semiconductor encapsulating materials, a low elastic modulus under a high temperature condition in order to improve reflow properties, a low curing shrinkage percentage in order to suppress reliability degradation caused by "warpage" of members due to a decrease in thickness of semiconductors, and the like are exemplified.

As for a resin material having a low dielectric constant and a low dielectric tangent in a cured product, a technique of using di(α-naphthyl) isophthalate as a curing agent of an epoxy resin is known (see PTL 1 listed below). When compared to the case of using a conventional epoxy resin curing agent such as a phenol novolac resin, the epoxy resin composition described in PTL 1, which uses di(α-naphthyl) isophthalate as an epoxy resin curing agent, certainly has low values of dielectric constant and dielectric tangent in a cured product but has low curability. Thus, it is necessary to cure the epoxy resin composition at a high temperature and for a long time so that there are problems of a degradation in productivity and energy cost upon the industrial use.

CITATION LIST

Patent Literature

PTL 1: JP-A-2003-82063

SUMMARY OF INVENTION

Technical Problem

Therefore, an object of the present invention is to provide an active ester composition capable of exhibiting high curability and forming a cured product with various excellent properties such as low dielectric properties, and to provide a curable composition and a cured product thereof, and a semiconductor encapsulating material and a printed wiring board which are obtained using the curable composition.

Solution to Problem

The present inventors have conducted intensive studies in order to solve the above-described problems, and as a result, found that a composition containing a phenolic hydroxyl group-containing compound and an esterification product of a phenolic hydroxyl group-containing compound and an aromatic polycarboxylic acid or an acid halide thereof is capable of exhibiting high curability and forming a cured product with various excellent properties such as low dielectric properties, thereby completing the present invention.

Specifically, the present invention relates to an active ester composition including as essential components: an active ester compound (A) that is an esterification product of a compound having one phenolic hydroxyl group in a molecular structure (a1) and an aromatic polycarboxylic acid or an acid halide thereof (a2); and a phenolic hydroxyl group-containing compound (B).

The present invention further relates to a curable composition including the active ester composition and a curing agent.

The present invention still further relates to a cured product of the curable composition.

The present invention still further relates to a semiconductor encapsulating material including the curable composition.

The present invention still further relates to a printed wiring board including a product obtained using the curable composition.

Advantageous Effects of Invention

According to the present invention, it is possible to provide an active ester composition capable of exhibiting high curability and forming a cured product with various excellent properties such as low dielectric properties, and to provide a curable composition and a cured product thereof, and a semiconductor encapsulating material and a printed wiring board which are obtained using the curable composition.

DESCRIPTION OF EMBODIMENTS

Hereinafter, the present invention will be described in detail.

An active ester composition according to the present invention includes, as essential components, an active ester compound (A) and a phenolic hydroxyl group-containing compound (B), in which the active ester compound (A) is an esterification product of a compound having one phenolic hydroxyl group in the molecular structure (a1) and an aromatic polycarboxylic acid or an acid halide thereof (a2).

The specific structure of the active ester compound (A) is not particularly limited as long as it is the esterification product of the compound having one phenolic hydroxyl group in a molecular structure (a1) and the aromatic polycarboxylic acid or the acid halide thereof (a2), and compounds having various different molecular structures may be used.

The compound having one phenolic hydroxyl group in a molecular structure (a1) may be any compound as long as it is an aromatic compound having one hydroxyl group on an aromatic ring, and other specific structure is not particularly limited. In the present invention, the compound having one phenolic hydroxyl group in a molecular structure (a1) may be used alone or in combination of two or more kinds thereof. Specific examples of the compound having one phenolic hydroxyl group in a molecular structure (a1) include phenol or a phenolic compound having one or a plurality of substituents on an aromatic nucleus of phenol, naphthol or a naphthol compound having one or a plurality of substituents on an aromatic nucleus of naphthol, and anthracenol or an anthracenol compound having one or a plurality of substituents on an aromatic nucleus of anthracenol. Examples of the substituent on an aromatic nucleus include aliphatic hydrocarbon groups such as a methyl group, an ethyl group, a vinyl group, a propyl group, a butyl group, a pentyl group, a hexyl group, a cyclohexyl group, a heptyl group, an octyl group, and a nonyl group; alkoxy groups such as a methoxy group, an ethoxy group, a propyloxy group, and a butoxy group; halogen atoms such as a fluorine atom, a chlorine atom, and a bromine atom; a phenyl group, a naphthyl group, an anthryl group, and an aryl group in which the aliphatic hydrocarbon group, the alkoxy group, the halogen atom, and the like are substituted on aromatic nuclei thereof; and a phenyl methyl group, a phenyl ethyl group, a naphthyl methyl group, a naphthyl ethyl group, and an aralkyl group in which the aliphatic hydrocarbon group, the alkoxy group, the halogen atom, and the like are substituted on aromatic nuclei thereof.

Among them, from the viewpoint of obtaining a cured product having a low curing shrinkage percentage and a low elastic modulus under a high temperature condition, a phenolic compound or a naphthol compound is preferable, and phenol, naphthol, or a compound having one or a plurality of aliphatic hydrocarbon groups or one or two aryl groups on aromatic nuclei thereof is more preferable.

The specific structure of the aromatic polycarboxylic acid or the acid halide thereof (a2) is not particularly limited as long as it is an aromatic compound which may form an ester bond by reaction with a phenolic hydroxyl group of the compound having one phenolic hydroxyl group in the molecular structure (a1), and may be any compound. Specific examples thereof include benzene dicarboxylic acids such as isophthalic acid and terephthalic acid; benzenetricarboxylic acids such as trimellitic acid; naphthalene dicarboxylic acids such as naphthalene-1,4-dicarboxylic acid, naphthalene-2,3-dicarboxylic acid, naphthalene-2,6-dicarboxylic acid, and naphthalene-2,7-dicarboxylic acid; acid halides thereof; and compounds in which the aliphatic hydrocarbon group, the alkoxy group, the halogen atom, and the like are substituted on aromatic nuclei thereof. Examples of the acid halide include acid chloride, acid bromide, acid fluoride, and oxyiodide. These may be used alone, respectively, or in combination of two or more kinds thereof. Of them, from the viewpoint of obtaining an active ester composition having both a low shrinkage percentage at the time of curing and a low elastic modulus under a high temperature condition in a cured product, benzene dicarboxylic acids such as isophthalic acid and terephthalic acid or an acid halide thereof is preferable.

From the above description, as a preferable specific structure of the active ester compound (A), for example, the following Structural Formula (1) or the like is exemplified.

The reaction of the compound having one phenolic hydroxyl group in a molecular structure (a1) and the aromatic polycarboxylic acid or the acid halide thereof (a2) can be performed, for example, by a method of heating and stirring in the presence of an alkali catalyst under a temperature condition of about 40 to 65° C. The reaction may be performed in an organic solvent as necessary. In addition, after the completion of the reaction, a reaction product may be purified by washing with water, reprecipitation, or the like, as desired.

Examples of the alkali catalyst include sodium hydroxide, potassium hydroxide, triethylamine, and pyridine. These may be used alone, respectively, or in combination of two or more kinds thereof. In addition, the alkali catalyst may be used as an aqueous solution of about 3.0 to 30%. Of them, sodium hydroxide or potassium hydroxide having high catalytic capacity is preferable.

Examples of the organic solvent include ketone solvents such as acetone, methyl ethyl ketone, and cyclohexanone; acetic acid ester solvents such as ethyl acetate, butyl acetate, cellosolve acetate, propylene glycol monomethyl ether acetate, and carbitol acetate; carbitol solvents such as cellosolve and butyl carbitol; aromatic hydrocarbon solvents such as toluene and xylene; dimethylformamide; dimethylacetamide; and N-methylpyrrolidone. These may be used alone, respectively, or as a mixed solvent of two or more kinds thereof.

Since a target active ester compound (A) is obtainable at a high yield, the reaction proportion of the compound having one phenolic hydroxyl group in a molecular structure (a1) and the aromatic polycarboxylic acid or the acid halide thereof (a2) is preferably a proportion in which the compound having one phenolic hydroxyl group in a molecular structure (a1) is 0.95 to 1.05 mol with respect to 1 mol of the total of the carboxyl group or acid halide group of the aromatic polycarboxylic acid or the acid halide thereof (a2).

Regarding the melt viscosity of the active ester compound (A), a value at 150° C. which is measured according to ASTM D4287 using an ICI viscometer is preferably in a range of 0.01 to 5 dPa·s.

The active ester composition of the present invention may contain another active ester compound or a resin along with the active ester compound (A). Examples of the other active ester compound or the resin include an active ester resin (A') containing, as essential reaction raw materials, a compound having one phenolic hydroxyl group in a molecular structure (a3), a compound having two or more phenolic hydroxyl groups in a molecular structure (a4), and an aromatic polycarboxylic acid or an acid halide thereof (a5).

Examples of the compound having one phenolic hydroxyl group in a molecular structure (a3) in the active ester resin (A') include the same compounds as the compound having one phenolic hydroxyl group in a molecular structure (a1).

[Chem. 1]

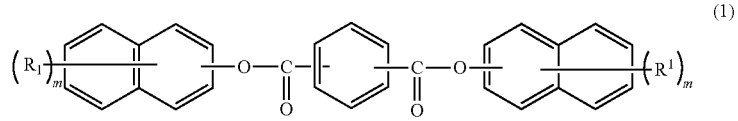

(1)

In the formula, R¹s each independently represent any one of an aliphatic hydrocarbon group, an alkoxy group, a halogen atom, an aryl group, and an aralkyl group, and m is 0 or an integer of 1 to 7.

Examples of the compound having two or more phenolic hydroxyl groups in a molecular structure (a4) include a novolac type resin having, as a reaction raw material, the same compound as the compound having one phenolic hydroxyl group in a molecular structure (a1) and a reaction product having, as essential reaction raw materials, the same compound as the compound having one phenolic hydroxyl group in a molecular structure (a1) and a compound (x) represented by any one of the following Structural Formulae (x-1) to (x-5):

[Chem. 2]

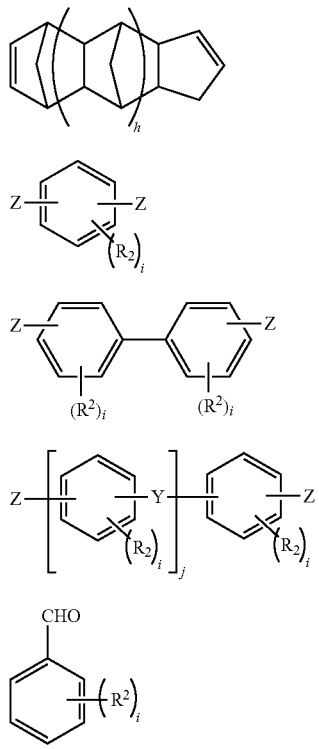

In the formulae, h is 0 or 1; $R^2$s each independently represent any one of an aliphatic hydrocarbon group, an alkoxy group, a halogen atom, an aryl group, and an aralkyl group; i is 0 or an integer of 1 to 4; Z represents any one of a vinyl group, a halomethyl group, a hydroxymethyl group, and an alkyloxy methyl group; Y represents any one of an alkylene group having 1 to 4 carbon atoms, an oxygen atom, a sulfur atom, and a carbonyl group; and j is an integer of 1 to 4.

The compound (a4) can be produced, for example, by a method of heating and stirring the compound (a1) and the compound (x) under the condition of an acid catalyst and under a temperature condition of about 80 to 180° C.

Examples of the aromatic polycarboxylic acid or the acid halide thereof (a5) include the same compounds as the aromatic polycarboxylic acid or the acid halide thereof (a2).

The active ester resin (A') may further have another compound as a reaction raw material in addition to the above-described components (a3) to (a5). Examples of the other compound include a substituent introducing agent (a6) for introducing an aliphatic hydrocarbon group, an alkoxy group, a halogen atom, an aryl group, or an aralkyl group as a substituent on an aromatic ring in the active ester resin (A2).

A method for producing the active ester resin (A') is not particularly limited, but for example, the production can be performed by a method of heating and stirring a reaction raw material containing the above-described components (a3) to (a5) in the presence of an alkali catalyst under a temperature condition of about 40 to 65° C. The reaction may be performed in an organic solvent as necessary. In addition, after the completion of the reaction, a reaction product may be purified by washing with water, reprecipitation, or the like, as desired.

Examples of the alkali catalyst include sodium hydroxide, potassium hydroxide, triethylamine, and pyridine. These may be used alone, respectively, or in combination of two or more kinds thereof. In addition, the alkali catalyst may be used as an aqueous solution of about 3.0 to 30%. Of them, sodium hydroxide or potassium hydroxide having high catalytic capacity is preferable.

Examples of the organic solvent include ketone solvents such as acetone, methyl ethyl ketone, and cyclohexanone; acetic acid ester solvents such as ethyl acetate, butyl acetate, cellosolve acetate, propylene glycol monomethyl ether acetate, and carbitol acetate; carbitol solvents such as cellosolve and butyl carbitol; aromatic hydrocarbon solvents such as toluene and xylene; dimethylformamide; dimethylacetamide; and N-methylpyrrolidone. These may be used alone, respectively, or as a mixed solvent of two or more kinds thereof.

The reaction proportion of the compound having one phenolic hydroxyl group in a molecular structure (a3), the compound having two or more phenolic hydroxyl groups in a molecular structure (a4), and the aromatic polycarboxylic acid or the acid halide thereof (a5) can be appropriately changed according to a desired molecular design. Particularly, from the viewpoint of obtaining an active ester resin composition having high solvent solubility and being easily used for various applications, a ratio of the mole number ($a3_{OH}$) of the hydroxyl group of the compound having one phenolic hydroxyl group in a molecular structure (a3) to the mole number ($a4_{OH}$) of the hydroxyl group of the compound having two or more phenolic hydroxyl groups in a molecular structure (a4) [($a3_{OH}$)/($a4_{OH}$)] is preferably a ratio of 10/90 to 75/25 and more preferably a ratio of 25/75 to 50/50.

Further, the total of the mole number of the hydroxyl group of the compound having one phenolic hydroxyl group in a molecular structure (a3) and the mole number of the hydroxyl group of the compound having two or more phenolic hydroxyl groups in a molecular structure (a4) is preferably a ratio of 0.95 to 1.05 mol, with respect to the total of 1 mol of the carboxyl group or acid halide group of the aromatic polycarboxylic acid or the acid halide thereof (a5).

The weight average molecular weight (Mw) of the active ester resin (A') is preferably in the range of 600 to 5,000 and particularly preferably in the range of 800 to 3,000. Incidentally, the weight average molecular weight (Mw) of the active ester resin (A') is a value measured by GPC under the following conditions.

Measurement apparatus: "HLC-8320 GPC" manufactured by Tosoh Corporation
Column: guard column "HXL-L" manufactured by Tosoh Corporation
+"TSK-GEL G4000HXL" manufactured by Tosoh Corporation
+"TSK-GEL G3000HXL" manufactured by Tosoh Corporation
+"TSK-GEL G2000HXL" manufactured by Tosoh Corporation +"TSK-GEL G2000HXL" manufactured by Tosoh Corporation Detector: RI (differential refractometer)

Data processing: "GPC WorkStation EcoSEC-WorkStation" manufactured by Tosoh Corporation Measurement conditions:

| column temperature | 40° C. |
|---|---|
| developing solvent | tetrahydrofuran |
| flow rate | 1.0 ml/min |

Standard: according to the measurement manual of "GPC-8320" described above, the following monodisperse polystyrene of which the molecular weight is known was used.

(Polystyrene Used)

"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation Sample: a solution (50 μl) obtained by filtering a tetrahydrofuran solution of 1.0% by mass in terms of the resin solid content through a microfilter Further, regarding the softening point of the active ester resin (A'), a value measured on the basis of JIS K7234 is preferably in the range of 100 to 180° C. and more preferably in the range of 120 to 170° C.

In a case where the active ester composition of the present invention contains the active ester resin (A') along with the active ester compound (A), the ratio of the active ester compound (A) to the total of both the active ester resin (A') and the active ester compound (A) is preferably in the range of 40 to 99% by mass, more preferably in the range of 50 to 99% by mass, and particularly preferably in the range of 65 to 99% by mass, from the viewpoint of obtaining an active ester composition having both a low shrinkage percentage at the time of curing and a low elastic modulus under a high temperature condition in a cured product.

The specific structure, the molecular weight, the hydroxyl equivalent, and the like of the phenolic hydroxyl group-containing compound (B) are not particularly limited as long as it is a compound having one or a plurality of phenolic hydroxyl groups in a molecular structure, and various many compounds can be used.

Examples of the phenolic hydroxyl group-containing compound (B) include a phenolic hydroxyl group-containing monomer compound (B1) having one or a plurality of phenolic hydroxyl groups on a benzene, naphthalene, or anthracene skeleton, and a phenolic hydroxyl group-containing resin (B2) having the phenolic hydroxyl group-containing monomer compound (B1) as a reaction raw material.

The number of phenolic hydroxyl groups in one molecule of the phenolic hydroxyl group-containing monomer compound (B1) is preferably in the range of 1 to 3 from the viewpoint of obtaining an active ester composition having excellent balance between curability and various performances such as low dielectric properties in a cured product. That is, examples of the phenolic hydroxyl group-containing phenolic hydroxyl group-containing monomer compound (B1) include phenol, dihydroxybenzene, trihydroxybenzene, naphthol, dihydroxynaphthalene, trihydroxynaphthalene, anthracenol, dihydroxyanthracene, trihydroxyanthracene, and compounds having one or a plurality of substituents on aromatic nuclei thereof. Examples of the substituent on aromatic nucleus include aliphatic hydrocarbon groups such as a methyl group, an ethyl group, a vinyl group, a propyl group, a butyl group, a pentyl group, a hexyl group, a cyclohexyl group, a heptyl group, an octyl group, and a nonyl group; alkoxy groups such as a methoxy group, an ethoxy group, a propyloxy group, and a butoxy group; halogen atoms such as a fluorine atom, a chlorine atom, and a bromine atom; a phenyl group, a naphthyl group, an anthryl group, and an aryl group in which the aliphatic hydrocarbon group, the alkoxy group, the halogen atom, and the like are substituted on aromatic nuclei thereof; and a phenyl methyl group, a phenyl ethyl group, a naphthyl methyl group, a naphthyl ethyl group, and an aralkyl group in which the aliphatic hydrocarbon group, the alkoxy group, the halogen atom, and the like are substituted on aromatic nuclei thereof. Among these, from the viewpoint of obtaining an active ester composition having excellent balance between curability and various performances such as low dielectric properties in a cured product, any compound of phenol, dihydroxybenzene, trihydroxybenzene, naphthol, dihydroxynaphthalene, trihydroxynaphthalene, anthracenol, dihydroxyanthracene, and trihydroxyanthracene is preferable.

Examples of the phenolic hydroxyl group-containing resin (B2) include a novolac type resin which is a condensation reaction product of the phenolic hydroxyl group-containing monomer compound (B1) and an aldehyde compound, and a reaction product having, as essential reaction raw materials, the phenolic hydroxyl group-containing monomer compound (B1) and the compound (x) represented by any one of Structural Formulae (x-1) to (x-5) described above.

Regarding the novolac type resin which is a condensation reaction product of the phenolic hydroxyl group-containing monomer compound (B1) and an aldehyde compound, examples of the aldehyde compound to be used include, in addition to formaldehyde, alkylaldehyde such as acetaldehyde and aromatic aldehyde such as benzaldehyde. The reaction proportion of the phenolic hydroxyl group-containing monomer compound (B1) and the aldehyde compound is appropriately adjusted according to a desired molecular weight or the like, but for example, the aldehyde compound is preferably used in the range of 0.01 to 0.9 mol with respect to 1 mol of the phenolic hydroxyl group-containing monomer compound (B1). The novolac type resin can be produced by the same method as that for a general phenol novolac type resin, and for example, can be produced by a method of heating and stirring under a temperature condition of about 80 to 180° C. under the condition of an acid catalyst, as necessary, using an organic solvent. The hydroxyl equivalent of the novolac type resin is preferably in the range of 100 to 250 g/eq and the softening point is preferably in the range of 60 to 130° C.

The reaction product having, as essential reaction raw materials, the phenolic hydroxyl group-containing monomer compound (B1) and the compound (x) represented by any one of Structural Formulae (x-1) to (x-5) described above can be produced, for example, by a method of heating and stirring the phenolic hydroxyl group-containing monomer compound (B1) and the compound (x) under a temperature condition of about 80 to 180° C. under the condition of an acid catalyst, as necessary, using an organic solvent. The hydroxyl equivalent of the obtained reaction product is preferably in the range of 150 to 300 g/eq and the softening point is preferably in the range of 60 to 150° C. Of reaction products having, as essential reaction raw materials, the phenolic hydroxyl group-containing monomer compound (B1) and the compound (x) represented by any one of Structural Formulae (x-1) to (x-5) described above, a reaction product obtained by using a compound represented by the above-described Structural Formula (x-2) as the compound (x) corresponds to a compound that is generally called a phenol aralkyl resin or the like. In addition, a reaction product obtained by using a compound represented by the above-described Structural Formula (x-3) as the compound (x) corresponds to a compound that is generally called a biphenyl aralkyl resin or the like.

The mixing proportion of the active ester compound (A) and the phenolic hydroxyl group-containing compound (B) in the active ester composition of the present invention is appropriately adjusted according to desired curability and physical properties of a cured product, but particularly, from the viewpoint of having excellent balance between curability and physical properties of a cured product, the phenolic hydroxyl group-containing compound (B) is preferably contained in the range of 0.1 to 300 parts by mass with respect to 100 parts by mass of the active ester compound (A). Further, in the case of using the phenolic hydroxyl group-containing monomer compound (B1) as the phenolic hydroxyl group-containing compound (B), the phenolic hydroxyl group-containing monomer compound (B1) is preferably contained in the range of 0.1 to 50 parts by mass and preferably contained in the range of 0.5 to 20 parts by mass with respect to 100 parts by mass of the active ester compound (A). Other than, in the case of using the phenolic hydroxyl group-containing resin (B2) as the phenolic hydroxyl group-containing compound (B), the phenolic hydroxyl group-containing resin (B2) is preferably contained in the range of 1 to 300 parts by mass, preferably contained in the range of 5 to 200 parts by mass, and further preferably contained in the range of 10 to 200 parts by mass with respect to 100 parts by mass of the active ester compound (A).

The functional group equivalent of the active ester composition of the present invention is preferably in the range of 150 to 360 g/eq from the viewpoint of having excellent balance between curability and physical properties of a cured product. Incidentally, the functional group in the active ester composition in the present invention refers to an ester binding site and a phenolic hydroxyl group in the active ester composition. Further, the functional group equivalent of the active ester composition is a value calculated from the amount of the reaction raw material charged.

The curable composition of the present invention contains the active ester composition and a curing agent. The curing agent may be a compound which may react with the active ester composition of the present invention, and various compounds can be used without particular limitation. As an example of the curing agent, for example, an epoxy resin is exemplified.

Examples of the epoxy resin include a phenol novolac type epoxy resin, a cresol novolac type epoxy resin, a naphthol novolac type epoxy resin, a bisphenol novolac type epoxy resin, a biphenol novolac type epoxy resin, a bisphenol type epoxy resin, a biphenyl type epoxy resin, a triphenol methane type epoxy resin, a tetraphenol ethane type epoxy resin, a dicyclopentadiene-phenol addition reaction type epoxy resin, a phenol aralkyl type epoxy resin, and a naphthol aralkyl type epoxy resin.

In the curable composition of the present invention, the mixing proportion of the active ester composition and the curing agent is not particularly limited, and can be appropriately adjusted according to desired cured product performance and the like. For example, the mixing proportion in the case of using an epoxy resin as the curing agent is preferably a proportion in which the total of the functional group in the active ester composition is 0.7 to 1.5 mol with respect to 1 mol of the total of the epoxy group in the epoxy resin.

The curable composition of the present invention may further contain a curing promoter. Examples of the curing promoter include phosphorus compound, tertiary amine, an imidazole compound, a pyridine compound, an organic acid metal salt, a Lewis acid, and an amine complex salt. Among them, from the viewpoint of being excellent in curability, heat resistance, electrical characteristics, moisture absorption resistance, and the like, triphenylphosphine as the phosphorus compound, 1,8-diazabicyclo-[5.4.0]-undecene (DBU) as the tertiary amine, 2-ethyl-4-methylimidazole as the imidazole compound, and 4-dimethylaminopyridine and 2-phenylimidazole as the pyridine compound are preferable. The amount of these curing promoters added are preferably in the range of 0.01 to 15% by mass in 100 parts by mass of the curable composition.

The curable composition of the present invention may further contain another resin component. Examples of the other resin component include amine compounds such as diaminodiphenylmethane, diethylene triamine, triethylene tetramine, diaminodiphenylsulfone, isophorone diamine, imidazole, a $BF_3$-amine complex, and a guanidine derivative; amide compounds such as dicyandiamide and a polyamide resin synthesized by a linolenic acid dimer and ethylenediamine; acid anhydrides such as phthalic anhydride, trimellitic anhydride, pyromellitic anhydride, maleic anhydride, tetrahydrophthalic anhydride, methyltetrahydrophthalic anhydride, methylnadic anhydride, hexahydrophthalic anhydride, and methylhexahydrophthalic anhydride; a cyanic acid ester resin; a bismaleimide resin; a benzoxazine resin; a styrene-maleic anhydride resin; an allyl group-containing resin typified by diallyl bisphenol or triallyl isocyanurate; and polyphosphoric acid ester or phosphoric acid ester-carbonate copolymer. These may be used alone, respectively, or in combination of two or more kinds thereof.

The mixing proportion of those other resin components is not particularly limited, and can be appropriately adjusted according to desired cured product performance and the like. As an example of the mixing proportion, the other resin component is used in the range of 1 to 50% by mass in the curable composition of the present invention.

The curable composition of the present invention may contain, as necessary, various additives such as a flame retardant, an inorganic filler, a silane coupling agent, a release agent, a pigment, and an emulsifier.

Examples of the flame retardant include inorganic phosphorus compounds such as red phosphorus, ammonium phosphates such as monoammonium phosphate, diammonium phosphate, triammonium phosphate, and ammonium polyphosphate, and amide phosphate; organic phosphorus compounds such as a phosphoric acid ester compound, a phosphonic acid compound, a phosphinic acid compound, a phosphine oxide compound, a phosphorane compound, an organic nitrogen-containing phosphorus compound, cyclic organic phosphorus compounds such as 9,10-dihydro-9-oxa- 10-phosphaphenanthrene-10-oxide, 10-(2,5-dihydroxyphenyl)-10H-9-oxa-10-phosphaphenanthrene-10-oxide, and 10-(2,7-dihydroxynaphthyl)-10H-9-oxa-10-phosphaphenanthrene-10-oxide, and derivatives obtained by reacting the cyclic organic phosphorus compounds with a compound such as an epoxy resin or a phenolic resin; nitrogen-based flame retardants such as a triazine compound, a cyanuric acid compound, an isocyanuric acid compound, and phenothiazine; silicone-based flame retardants such as silicone oil, silicone rubber, and a silicone resin; and inorganic flame retardants such as metal hydroxide, metal oxide, a metal carbonate compound, metal powder, a boron compound, and low melting point glass. In the case of using those flame retardants, the flame retardant is preferably used in the range of 0.1 to 20% by mass in the curable composition.

The inorganic filler is mixed, for example, in a case where the curable composition of the present invention is used for an application to a semiconductor encapsulating material. Examples of the inorganic filler include fused silica, crystalline silica, alumina, silicon nitride, and aluminum hydroxide. Of them, from the viewpoint that the inorganic filler can be mixed more, the fused silica is preferable. Although either crushed or spherical fused silica can be used, the spherical fused silica is preferably mainly used for increasing the amount of the fused silica mixed and suppressing an increase in melt viscosity of the curable composition. In order to further increase the amount of the spherical silica mixed, the grain size distribution of the spherical silica is preferably properly adjusted. The filling rate is preferably in the range of 0.5 to 95 parts by mass in 100 parts by mass of the curable composition.

Other than, in a case where the curable composition of the present invention is used for an application to a conductive paste or the like, a conductive filler such as silver powder or copper powder can be used.

The active ester composition and the curable composition using the same of the present invention have a feature that curability is high and various performances such as low dielectric properties in a cured product are excellent. As the cured product performance, other than low dielectric properties, a low elastic modulus under a high temperature condition, excellent moisture absorption resistance, excellent heat resistance, and the like are exemplified. Other than, the active ester composition and the curable composition using the same of the present invention have also sufficiently high general required performance, which is required for a resin material, such as a low curing shrinkage percentage at the time of curing and high solubility to a general-purpose organic solvent. Therefore, the active ester composition and the curable composition using the same of the present invention can also be widely used for an application to a coating material, an adhesive, a molded product, or the like in addition to the application to an electronic material such as a semiconductor encapsulating material, a printed wiring board, or a resist material.

In a case where the curable composition of the present invention is used for an application to a semiconductor encapsulating material, generally, an inorganic filler is preferably mixed. The semiconductor encapsulating material can be produced, for example, by mixing a mixture using an extruder, a kneader, a roll, or the like. As a method for molding a semiconductor package using the obtained semiconductor encapsulating material, for example, there is exemplified a method of casting the semiconductor encapsulating material or molding the semiconductor encapsulating material using a transfer molding machine, an injection molding machine, or the like and then heating the resultant product under a temperature condition of 50 to 200° C. for 2 to 10 hours, and a semiconductor device as a molded product can be obtained by such a method.

In a case where the curable composition of the present invention is used for an application to a printed wiring board or an application to an adhesive film for build-up, generally, the curable composition is preferably diluted by mixing an organic solvent and then used. Examples of the organic solvent include methyl ethyl ketone, acetone, dimethylformamide, methyl isobutyl ketone, methoxypropanol, cyclohexanone, methyl cellosolve, ethyl diglycol acetate, and propylene glycol monomethyl ether acetate. The type and mixed amount of the organic solvent can be appropriately adjusted according to usage environment of the curable composition, but for example, in an application to a printed circuit board, a polar solvent having a boiling point of 160° C. or lower, such as methyl ethyl ketone, acetone, or dimethylformamide, is preferable, and is preferably used at a nonvolatile content ratio of 40 to 80% by mass. In an application to an adhesive film for build-up, it is preferable to use ketone solvents such as acetone, methyl ethyl ketone, and cyclohexanone; acetic acid ester solvents such as ethyl acetate, butyl acetate, cellosolve acetate, propylene glycol monomethyl ether acetate, and carbitol acetate; carbitol solvents such as cellosolve and butyl carbitol; aromatic hydrocarbon solvents such as toluene and xylene; dimethylformamide; dimethylacetamide; N-methylpyrrolidone; and the like. Such an organic solvent is preferably used at a nonvolatile content ratio of 30 to 60% by mass.

Further, as a method for producing a printed wiring board using the curable composition of the present invention, for example, a method is exemplified in which the curable composition is impregnated with a reinforcing substrate and then cured to obtain a prepreg, and a copper foil is pressure-bonded thereon under heating. Examples of the reinforcing substrate include paper, a glass cloth, a glass nonwoven fabric, aramid paper, an aramid cloth, a glass mat, and a glass roving cloth. The amount of the curable composition impregnated is not particularly limited, but generally, is preferably adjusted such that the resin content in the prepreg is 20 to 60% by mass.

EXAMPLES

Next, the present invention will be described in more detail by way of Examples and Comparative Examples. The descriptions "part" and "%" in Examples are on the basis of the mass unless otherwise stated particularly.

In this Example, the melt viscosity of the active ester compound (A) is a value at 150° C. which is measured according to ASTM D4287 with an ICI viscometer.

Production Example 1 Production of Active Ester Compound (A1)

Into a flask equipped with a thermometer, a dropping funnel, a cooling pipe, a fractionating column, and a stirrer, 202.0 g of isophthalic acid chloride and 1250 g of toluene were charged, and the content was dissolved under reduced pressure in a system purged with nitrogen. Then, 288.0 g of 1-naphthol was charged, and the content was dissolved under reduced pressure in a system purged with nitrogen. 0.63 g of tetrabutylammonium bromide was added thereto under purging with nitrogen gas while the temperature inside the system was controlled to 60° C. or lower, and 400 g of a 20% sodium hydroxide aqueous solution was added dropwise thereto over 3 hours. After the completion of the dropwise addition, stirring was continued for 1 hour without any changes to perform reaction. After the completion of the reaction, the reaction mixture was left to stand in order to separate into phases, and the water layer was removed. Water was added to the remaining organic layer and mixed and stirred for about 15 minutes, and then the mixture was left to stand in order to separate into phases, and the water layer was removed. This operation was repeated until the pH of the water layer reached 7. Thereafter, the moisture and toluene were removed by dehydration with a decanter to obtain an active ester compound (A1). The melt viscosity of the active ester compound (A1) was 0.6 dPa·s.

Production Example 2 Production of Active Ester Compound (A-2)

Into a flask equipped with a thermometer, a dropping funnel, a cooling pipe, a fractionating column, and a stirrer, 202.0 g of isophthalic acid chloride and 1400 g of toluene were charged, and the content was dissolved under reduced pressure in a system purged with nitrogen. Then, 340.0 g of orthophenyl phenol was charged, and the content was dissolved under reduced pressure in a system purged with nitrogen. 0.70 g of tetrabutylammonium bromide was added thereto under purging with nitrogen gas while the temperature inside the system was controlled to 60° C. or lower, and 400 g of a 20% sodium hydroxide aqueous solution was added dropwise thereto over 3 hours. After the completion of the dropwise addition, stirring was continued for 1 hour without any changes to perform reaction. After the completion of the reaction, the reaction mixture was left to stand in order to separate into phases, and the water layer was removed. Water was added to the remaining organic layer and mixed and stirred for about 15 minutes, and then the mixture was left to stand in order to separate into phases, and the water layer was removed. This operation was repeated until the pH of the water layer reached 7. Thereafter, the moisture and toluene were removed by dehydration with a decanter to obtain an active ester compound (A-2). The melt viscosity of the active ester compound (A-2) was 0.2 dP·s.

Examples 1 to 7 and Comparative Examples 1 and 2

Each set of components were mixed in the proportions shown in Table 1 below to form a curable composition. As for the obtained curable composition, the gel time, and the dielectric constant of a cured product, and the elastic modulus of the cured product under high temperature conditions were measured in the following manner. The results are presented in Table 1.

Measurement of Gel Time

Each set of components were mixed in proportions shown in Table 1 below to form a curable composition. Immediately thereafter, 0.15 g of the curable composition was placed on a hot plate heated to 175° C., and then the time taken for the curable composition to reach a gel state was measured while the composition was stirred with a spatula. The same operation was repeated three times, and the average value was used for evaluation.
A: 10 seconds or longer and shorter than 50 seconds
B: 50 seconds or longer and shorter than 100 seconds
C: 100 seconds or longer and shorter than 150 seconds
D: 150 seconds or longer Measurement of Dielectric Constant The curable composition was poured into a mold and molded at a temperature of 175° C. for 10 minutes using a pressing machine. The molded product was taken out from the mold and then cured at a temperature of 175° C. for 5 hours. The cured molded product was cut into a size of 1 mm×54 mm×1.6 mm, and the resultant product was used as a test piece.

After vacuum drying under heating, the dielectric constant and dielectric tangent at 1 GHz of the test piece stored in the room at 23° C. and a humidity of 50% for 24 hours were measured according to JIS-C-6481 using an impedance material analyzer "HP4291B" manufactured by Agilent Technologies.
A: less than 3.00
B: 3.00 or more Measurement of Elastic Modulus Under High Temperature Condition The curable composition was poured into a mold and molded at a temperature of 175° C. for 10 minutes using a pressing machine. The molded product was taken out from the mold and then cured at a temperature of 175° C. for 5 hours. The cured molded product was cut into a size of 5 mm×54 mm×2.4 mm, and the resultant product was used as a test piece.

The storage elastic modulus at 260° C. of the test piece was measured using a viscoelasticity measuring apparatus ("solid viscoelasticity measuring apparatus RSAII" manufactured by Rheometric Scientific Inc.) by a rectangular tension method under the conditions of a frequency of 1 Hz and a temperature raising rate of 3° C./min.
A: 1 MPa or more and less than 25 MPa
B: 25 MPa or more and less than 50 MPa
C: 50 MPa or more

TABLE 1

| | | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Active ester compound (A1) | [parts by mass] | 34.0 | 20.4 | 37.2 | 38.0 | 48.8 | | 34.0 | | 50.8 |
| Active ester compound (A2) | [parts by mass] | | | | | | 35.3 | | | |
| Phenolic hydroxyl group-containing monomer compound (B1-1) | [parts by mass] | | | | | 2.0 | | | | |
| Phenolic hydroxyl group-containing resin (B2-1) | [parts by mass] | 11.2 | 20.4 | | | | 11.7 | 11.2 | 34.0 | |

TABLE 1-continued

|  |  | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Phenolic hydroxyl group-containing resin (B2-2) | [parts by mass] |  |  | 12.4 |  |  |  |  |  |  |
| Phenolic hydroxyl group-containing resin (B2-3) | [parts by mass] |  |  |  | 12.7 |  |  |  |  |  |
| Epoxy resin (1) | [parts by mass] | 54.8 | 59.2 | 50.4 | 49.3 | 49.2 | 53.0 | 54.8 | 66.0 | 49.2 |
| Triphenylphosphine | [parts by mass] | 1.0 | 1.0 | 1.0 | 1.0 | 1.0 | 1.0 |  | 1.0 |  |
| 2-Phenylimidazole | [parts by mass] |  |  |  |  |  |  | 1.0 |  | 1.0 |
| Gel time | [sec] | A | A | A | B | B | A | B | A | D |
| Dielectric constant |  | A | A | A | A | A | A | A | B | A |
| Storage elastic modulus at 260° C. | [Mpa] | A | A | A | A | A | A | A | C | A |

Details of Respective Components in Table

Phenolic hydroxyl group-containing monomer compound (B1-1): pyrogallol

Phenolic hydroxyl group-containing resin (B2-1): a phenol novolac resin ("TD-2131" manufactured by DIC Corporation, hydroxyl equivalent of 104 g/eq, softening point of 80° C.)

Phenolic hydroxyl group-containing resin (B2-2): a phenol aralkyl resin ("HE100C-15" manufactured by AIR WATER INC., hydroxyl equivalent of 174 g/eq, softening point of 75° C.)

Phenolic hydroxyl group-containing resin (B2-3): a biphenyl aralkyl resin ("HE200C-10" manufactured by AIR WATER INC., hydroxyl equivalent of 204 g/eq, softening point of 72° C.)

Epoxy resin (1): a cresol novolac type epoxy resin ("N-655-EXP-S" manufactured by DIC Corporation, epoxy equivalent of 202 g/eq)

Examples 8 to 14 and Comparative Example 3

Respective components were mixed at a ratio presented in the following Table 2 to obtain a curable composition. Regarding the obtained curable composition, the moisture absorption resistance and the curing shrinkage percentage of the cured product were measured by the following manner. The results are presented in Table 2.

Evaluation of Moisture Absorption Resistance

The curable composition was poured into a mold and molded at a temperature of 175° C. for 10 minutes using a pressing machine. The molded product was taken out from the mold and then cured at a temperature of 175° C. for 5 hours. The cured molded product was cut into a size of 90 mm×110 mm×2.4 mm, and the resultant product was used as a test piece.

The obtained molded product was left to stand in an atmosphere of 85° C./85% RH for 300 hours, and then a moisture absorption test was performed. The mass of the molded product before and after the test was measured, and a mass change rate was evaluated as moisture absorptivity.
  A: less than 1% by mass
  B: 1% by mass or more Measurement of Curing Shrinkage Percentage The curable composition was injection-molded using a transfer molding machine ("KTS-15-1.5C" manufactured by Kohtaki Precision Machine Co., Ltd.) under the conditions of a mold temperature of 154° C., a molding pressure of 9.8 MPa, and a curing time of 600 seconds to obtain a molded product having a length of 110 mm, a width of 12.7 mm, and a thickness of 1.6 mm. Then, the obtained molded product was cured at 175° C. for 5 hours, and then left to stand at room temperature (25° C.) for 24 hours, and the resultant product was used as a test piece. The size in the longitudinal direction of the test piece at room temperature and the inner size in the longitudinal direction of the mold at 154° C. were respectively measured and the curing shrinkage percentage was calculated by the following equation.

Curing shrinkage percentage (%)={(the inner size in the longitudinal direction of the mold at 154° C.)−(the size in the longitudinal direction of the test piece at room temperature)}/(the inner size in the longitudinal direction of the mold at 154° C.)×100(%)
  A: less than 1%
  B: 1% or more

TABLE 2

|  |  | Example 8 | Example 9 | Example 10 | Example 11 | Example 12 | Example 13 | Example 14 | Comparative Example 3 |
|---|---|---|---|---|---|---|---|---|---|
| Active ester compound (A1) | [parts by mass] | 34.0 | 20.4 | 37.2 | 38.0 | 48.8 |  | 34.0 |  |
| Active ester compound (A2) | [parts by mass] |  |  |  |  |  | 35.3 |  |  |
| Phenolic hydroxyl group-containing monomer compound (B1-1) | [parts by mass] |  |  |  |  |  | 2.0 |  |  |
| Phenolic hydroxyl group-containing resin (B2-1) | [parts by mass] | 11.2 | 20.4 |  |  |  | 11.7 | 11.2 | 34.0 |

TABLE 2-continued

| | | Example 8 | Example 9 | Example 10 | Example 11 | Example 12 | Example 13 | Example 14 | Comparative Example 3 |
|---|---|---|---|---|---|---|---|---|---|
| Phenolic hydroxyl group-containing resin (B2-2) | [parts by mass] | | | 12.4 | | | | | |
| Phenolic hydroxyl group-containing resin (B2-3) | [parts by mass] | | | | 12.7 | | | | |
| Epoxy resin (1) | [parts by mass] | 54.8 | 59.2 | 50.4 | 49.3 | 49.2 | 53.0 | 54.8 | 66.0 |
| Triphenylphosphine | [parts by mass] | 1.0 | 1.0 | 1.0 | 1.0 | 1.0 | 1.0 | | 1.0 |
| 2-Phenylimidazole | [parts by mass] | | | | | | | 1.0 | |
| Fused silica | [parts by mass] | 100 | 100 | 100 | 100 | 100 | 100 | 100 | 100 |
| Silane coupling agent | [parts by mass] | 0.5 | 0.5 | 0.5 | 0.5 | 0.5 | 0.5 | 0.5 | 0.5 |
| Carnauba wax | [parts by mass] | 0.7 | 0.7 | 0.7 | 0.7 | 0.7 | 0.7 | 0.7 | 0.7 |
| Moisture absorptivity | [% by mass] | A | A | A | A | A | A | A | B |
| Curing shrinkage percentage | [%] | A | A | A | A | A | A | A | B |

The invention claimed is:

1. An active ester composition comprising as essential components:

an active ester compound (A) that is an esterification product of a compound having one phenolic hydroxyl group in a molecular structure (a1) and an aromatic polycarboxylic acid or an acid halide thereof (a2); and a phenolic hydroxyl group-containing compound (B), wherein the phenolic hydroxyl group-containing compound (B) is one or more selected from a phenolic hydroxyl group-containing monomer compound (B1), a novolac type resin that is a condensation reaction product of the phenolic hydroxyl group-containing monomer compound (B1) and an aldehyde compound and has a hydroxyl equivalent in the range of 100 to 250 g/eq, and a reaction product of raw materials including, as essential reactive raw materials, the phenolic hydroxyl group-containing monomer compound (B1) and a compound (x) represented by any one of the following Structural Formulae (x-1) to (x-5):

[Chem. 1]

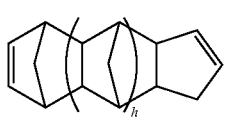
(x-1)

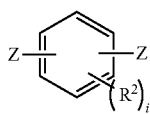
(x-2)

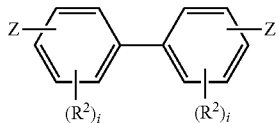
(x-3)

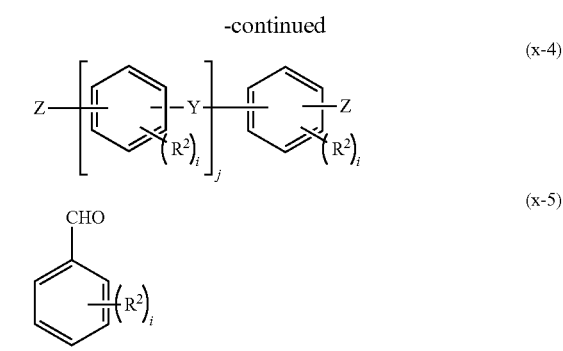

wherein h is 0 or 1; $R^2$s each independently represent any one of an aliphatic hydrocarbon group, an alkoxy group, a halogen atom, an aryl group, and an aralkyl group; i is 0 or an integer of 1 to 4; Z represents any one of a vinyl group, a halomethyl group, a hydroxymethyl group, and an alkyloxy methyl group; Y represents any one of an alkylene group having 1 to 4 carbon atoms, an oxygen atom, a sulfur atom, and a carbonyl group; and j is an integer of 1 to 4, the reaction product having a hydroxyl equivalent in the range of 150 to 300 g/eq.

2. The active ester composition according to claim 1, wherein the active ester composition comprises 100 parts by mass of the active ester compound (A) and 0.1 to 300 parts by mass of the phenolic hydroxyl group-containing compound (B).

3. A curable composition comprising the active ester composition according to claim 1 and a curing agent.

4. A cured product comprising a product obtained by curing the curable composition according to claim 3.

5. A semiconductor encapsulating material comprising the curable composition according to claim 3.

6. A printed wiring board comprising a product obtained using the curable composition according to claim 3.

7. A curable composition comprising the active ester composition according to claim 2 and a curing agent.

8. A cured product comprising a product obtained by curing the curable composition according to claim 7.

9. A semiconductor encapsulating material comprising the curable composition according to claim 7.

10. A printed wiring board comprising a product obtained using the curable composition according to claim 7.

* * * * *